(12) United States Patent
Hua et al.

(10) Patent No.: US 11,522,121 B2
(45) Date of Patent: Dec. 6, 2022

(54) TACTILE REPRODUCTION DEVICE, METHOD FOR DRIVING SAME, AND TACTILE REPRODUCTION APPARATUS

(71) Applicant: BOE Technology Group Co., Ltd., Beijing (CN)

(72) Inventors: Hui Hua, Beijing (CN); Yuju Chen, Beijing (CN); Xiaofeng Yin, Beijing (CN)

(73) Assignee: BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 0 days.

(21) Appl. No.: 17/485,227

(22) Filed: Sep. 24, 2021

(65) Prior Publication Data

US 2022/0238782 A1 Jul. 28, 2022

(30) Foreign Application Priority Data

Jan. 27, 2021 (CN) .......................... 202110114233.4

(51) Int. Cl.
*H01L 41/047* (2006.01)
*G06F 3/01* (2006.01)
*H02N 2/00* (2006.01)

(52) U.S. Cl.
CPC .......... *H01L 41/0472* (2013.01); *G06F 3/016* (2013.01); *H01L 41/0478* (2013.01); *H02N 2/001* (2013.01); *H02N 2/0075* (2013.01)

(58) Field of Classification Search
None
See application file for complete search history.

(56) References Cited

U.S. PATENT DOCUMENTS

2001/0011862 A1* 8/2001 Ando ................... H01L 41/0472
310/365
2004/0051423 A1* 3/2004 Florian ................. H01L 41/083
310/328

(Continued)

FOREIGN PATENT DOCUMENTS

CN 105892757 A 8/2016
CN 108874204 A 11/2018
(Continued)

*Primary Examiner* — Nicholas J Lee
(74) *Attorney, Agent, or Firm* — IPro, PLLC (57) ABSTRACT

A tactile reproduction device, a method for driving the same, and a tactile reproduction apparatus. Tactile reproduction device may simulate textures to implement tactile reproduction. tactile reproduction device includes a plurality of piezoelectric units, includes: first electrode, piezoelectric section, and second electrode which are laminated, wherein the second electrode includes: first comb electrode and second comb electrode; the first comb electrode includes: a plurality of first comb-teeth electrodes and a first comb-shank electrode connecting the plurality of first comb-teeth electrodes; the second comb electrode includes: a plurality of second comb-teeth electrodes and a second comb-shank electrode connecting the plurality of second comb-teeth electrodes; the plurality of first comb-teeth electrodes and the plurality of second comb-teeth electrodes are mutually intersected; the first electrode includes a plurality of electrode units which are not connected to each other. The present disclosure is applicable to the production of tactile reproduction devices.

20 Claims, 9 Drawing Sheets

(56) References Cited

U.S. PATENT DOCUMENTS

| | | | |
|---|---|---|---|
| 2014/0021830 A1* | 1/2014 | Ogata | H01L 41/293 29/25.35 |
| 2017/0310305 A1* | 10/2017 | Komura | H03H 9/02992 |
| 2018/0326454 A1 | 11/2018 | Khoshkava et al. | |
| 2018/0329493 A1 | 11/2018 | Khoshkava | |

FOREIGN PATENT DOCUMENTS

| | | |
|---|---|---|
| CN | 108878470 A | 11/2018 |
| DE | 19712496 A1 | 10/1997 |

* cited by examiner

TACTILE REPRODUCTION DEVICE, METHOD FOR DRIVING SAME, AND TACTILE REPRODUCTION APPARATUS

CROSS REFERENCE TO RELEVANT DISCLOSURES

The present disclosure claims the priority of the Chinese patent disclosure filed on Jan. 27, 2021 before the Chinese Patent Office with the disclosure number of 202110114233.4 and the title of "TACTILE REPRODUCTION DEVICE, METHOD FOR DRIVING SAME, AND TACTILE REPRODUCTION APPARATUS", which is incorporated herein in its entirety by reference.

TECHNICAL FIELD

The present disclosure relates to the technical field of tactile reproduction, and in particular, relates to a tactile reproduction device, a method for driving the same, and a tactile reproduction apparatus.

BACKGROUND

Feeling surface textures of different objects is an important component of the interaction of a human being with a surrounding environment. The texture rendering technology has a wide application prospect in fields such as Braille reading, safe driving, and augmented reality (AR)/virtual reality (VR).

SUMMARY

Embodiments of the present disclosure provides a tactile reproduction device, a method for driving the same, and a tactile reproduction apparatus.

The embodiments of the present disclosure employ the following technical solutions:

In one aspect, a tactile reproduction device is provided. The tactile reproduction device includes: a substrate, and a plurality of piezoelectric units that are disposed on the substrate in an array arrangement, wherein each of the piezoelectric units includes: a first electrode, a piezoelectric section, and a second electrode, which are laminated on the substrate in sequence.

each of the second electrodes comprises: a first comb electrode and a second comb electrode, the first comb electrode comprises: a plurality of first comb-teeth electrodes and a first comb-shank electrode connecting the plurality of first comb-teeth electrodes, the second comb electrode comprises: a plurality of second comb-teeth electrodes and a second comb-shank electrode connecting the plurality of second comb-teeth electrodes, and the plurality of first comb-teeth electrodes and the plurality of second comb-teeth electrodes are mutually intersected; and each of the first electrodes comprises a plurality of electrode units which are not connected to each other, and orthographic projections of the plurality of electrode units on the substrate are within orthographic projections of the first and second comb electrodes on the substrate.

Optionally, the orthographic projections of the plurality of electrode units on the substrate are within orthographic projections of the plurality of first comb-teeth electrodes on the substrate;

or the orthographic projections of the plurality of electrode units on the substrate are within orthographic projections of the plurality of second comb-teeth electrodes on the substrate.

Optionally, the plurality of electrode units are divided into a first group and a second group; orthographic projections of the first group of the electrode units on the substrate are within orthographic projections of the plurality of first comb-teeth electrodes on the substrate; and orthographic projections of the second group of the electrode units on the substrate are within orthographic projections of the plurality of second comb-teeth electrodes on the substrate.

Optionally, the first group of the electrode units and the second group of the electrode units are arranged at interval.

Optionally, each of the electrode units comprises a plurality of connected sub-electrodes.

Optionally, the plurality of sub-electrodes are arranged in a grid shape or in parallel.

Optionally, materials for the first and second electrodes comprise a transparent metal oxide.

Optionally, the material for the substrate comprises at least one of followings: Polyimide, Polyethylene Terephthalate and Polydimethylsiloxane.

Optionally, the material for the piezoelectric section comprises at least one of followings: polyvinylidene fluoride and polyvinylidene difluoride-trifluoroethylene copolymer.

In another aspect, a tactile reproduction apparatus is provided. The tactile reproduction device includes: a display panel and the tactile reproduction device defined above.

In yet another aspect, a method for driving a tactile reproduction device is provided. The method includes:

inputting first signals to the first comb electrodes of the second electrodes;

The embodiments of the present disclosure provide a tactile reproduction device, a method for driving the same, and a tactile reproduction apparatus. The tactile reproduction device includes: a substrate, and a plurality of piezoelectric units that are disposed on the substrate in an array arrangement. Each of the piezoelectric units includes: a first electrode, a piezoelectric section, and a second electrode which are laminated on the substrate in sequence. Each of the second electrodes includes: a first comb electrode and a second comb electrode; the first comb electrode includes: a plurality of first comb-teeth electrodes and a first comb-shank electrode connecting the plurality of first comb-teeth electrodes; the second comb electrode includes: a plurality of second comb-teeth electrodes and a second comb-shank electrode connecting the plurality of second comb-teeth electrodes; the plurality of first comb-teeth electrodes and the plurality of second comb-teeth electrodes are mutually intersected. Each of the first electrodes includes a plurality of electrode units which are not connected to each other; and orthographic projections of the plurality of electrode units on the substrate are within orthographic projections of the first and second comb electrodes on the substrate.

Then, different in voltage signals are input to the first and second comb electrodes of the second electrodes, in such a way that electric fields are produced between the adjacent first and second comb electrodes, thereby causing the piezoelectric sections between the first and second comb electrodes to vibrate. Meanwhile, voltage signals are input to the first electrodes in such a way that electric fields are produced between the first and second electrodes, thereby causing the piezoelectric sections below the first and second comb electrodes to vibrate. In this way, the vibrations of the piezoelectric sections are effectively enhanced under the actions of the above mentioned two electric fields, thereby improving the efficiency in changing the effective coefficient of friction of the surface of the device based on the vibrations.

BRIEF DESCRIPTION OF THE DRAWINGS

To describe the technical solutions in the embodiments of the present disclosure or in the prior art more clearly, the following briefly introduces the accompanying drawings to be used in the descriptions of the embodiments or the prior art. Obviously, the accompanying drawings in the following description show merely some embodiments of the present disclosure, and a person of ordinary skills in the art may still derive other drawings from these accompanying drawings without creative efforts.

FIG. 5b is an enlarged view of a region A in FIG. 5a;

FIG. 9 is a schematic structural diagram of a first electrode in FIG. 3a;

DETAILED DESCRIPTION

The technical solutions in the embodiments of the present disclosure will be described clearly and completely below in conjunction with the accompanying drawings in the embodiments of the present disclosure. Obviously, the embodiments described are merely some instead of all of the embodiments of the present disclosure. Based on the embodiments of the present disclosure, every other embodiment obtained by a person of ordinary skills in the art without making inventive efforts shall fall within the protection scope of the present disclosure.

In the embodiments of the present disclosure, words such as "first", "second", "third", and "fourth" are used to distinguish identical or similar items with substantially the same functions and effects, merely for the purpose of clearly describing the technical solutions of the embodiments of the present disclosure. These should not to be construed as indicating or implying relative importance or implicitly specifying the number of technical features indicated.

In the embodiments of the present disclosure, unless otherwise clearly specified, "a plurality of" means two or more.

In the embodiments of the present disclosure, terms such as "up" and "down" indicate directions or positional relations based on the directions or position relations shown in the accompanying drawings only for the purposes of describing the present disclosure and simplifying the description, instead of indicating or implying that a referred device or element must have a specific direction or must be constructed and operated in a specific direction. Therefore, these terms should not be construed as limiting the present disclosure.

Figure 1:
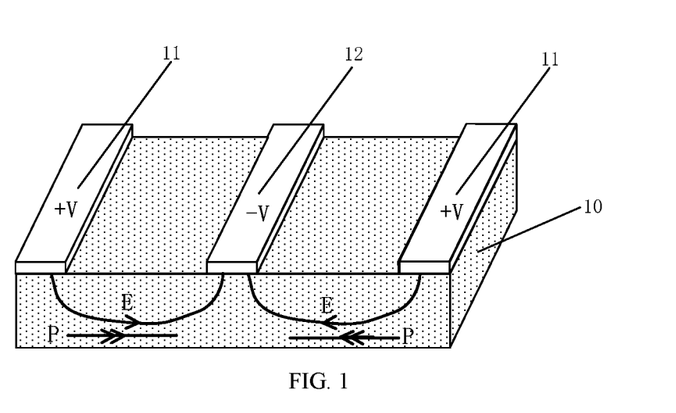
FIG. 1 is a schematic structural diagram of a tactile reproduction device provided in the related art.

In the related art, referring to the depiction in FIG. 1, a tactile reproduction device based on a piezoelectric material includes a piezoelectric ceramic film (a PZT film) 10, and interdigital electrodes disposed on an upside of the piezoelectric ceramic film 10. Here, the interdigital electrodes include first interdigits 11 and second interdigits 12. If +V voltage signals and −V voltage signals are input to the first interdigits 11 and the second interdigits 12 of the device respectively, parts of the piezoelectric ceramic film 10 between the first interdigits 11 and the second interdigits 12 may vibrate in electric fields E. However, the piezoelectric ceramic film below the interdigital electrodes is not effectively utilized. In FIG. 1, P represents a direction of strains produced by the piezoelectric ceramic film; the +V voltage signals refer to signals greater than a reference voltage; the −V voltage signals refers to signals smaller than the reference voltage; and a reference voltage signal may be a ground signal, etc.

Based on the description above, an embodiment of the present disclosure provides a tactile reproduction device. Referring to the depiction in FIG. 2, the tactile reproduction device includes: a substrate 4, and a plurality of piezoelectric units 5 that are disposed on the substrate 4 in an array arrangement.

Figure 2:
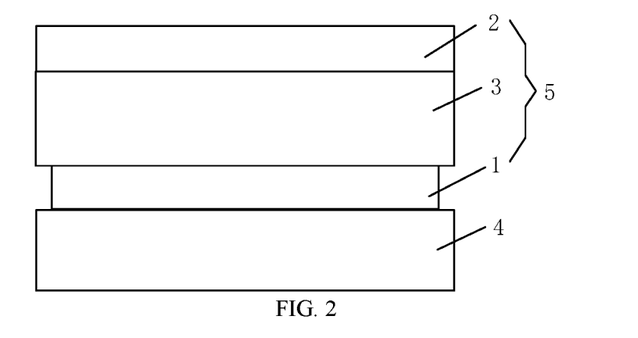
FIG. 2 is a schematic structural diagram of a tactile reproduction device according to an embodiment of the present disclosure.

Each of the piezoelectric units 5 includes: a first electrode 1, a piezoelectric section 3, and a second electrode 2, which are laminated on the substrate 4 in sequence.

Figure 4:
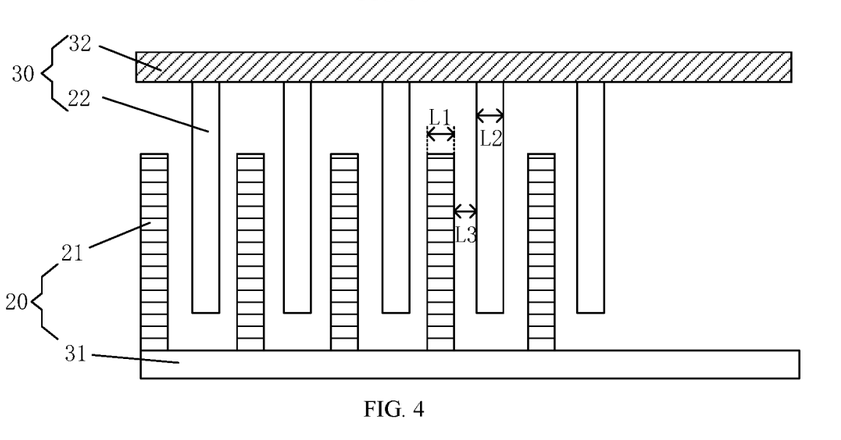
FIG. 4 is a schematic structural diagram of a second electrode according to an embodiment of the present disclosure.

Referring to the depiction in FIG. 4, each of the second electrodes includes a first comb electrode 20 and a second comb electrode 30; the first comb electrode 20 includes: a plurality of first comb-teeth electrodes 21 and a first comb-shank electrode 31 connecting the plurality of first comb-teeth electrodes 21; the second comb electrode 30 includes: a plurality of second comb-teeth electrodes 22 and a second comb-shank electrode 32 connecting the plurality of second comb-teeth electrodes 22; and the plurality of first comb-teeth electrodes 21 and the plurality of second comb-teeth electrodes 22 are mutually intersected in arrangement.

Figure 7:
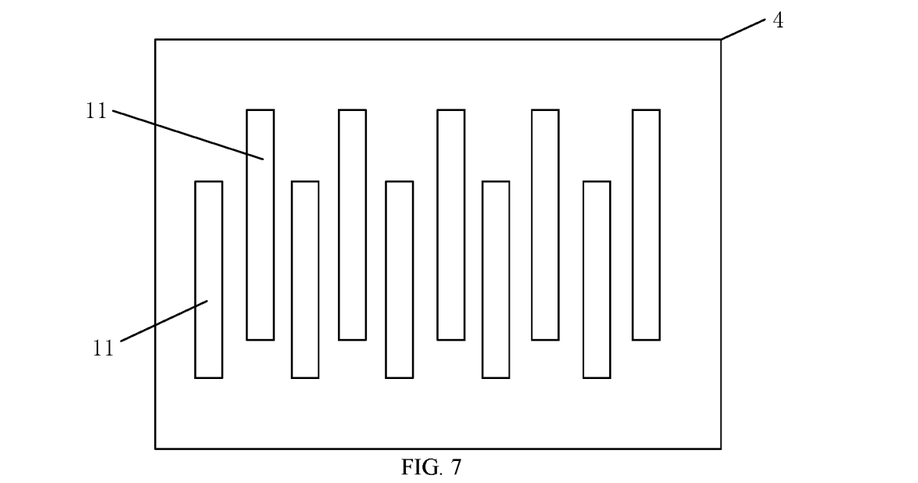
FIG. 7 is a schematic structural diagram of a first electrode in FIG. 3c.
Figure 8:
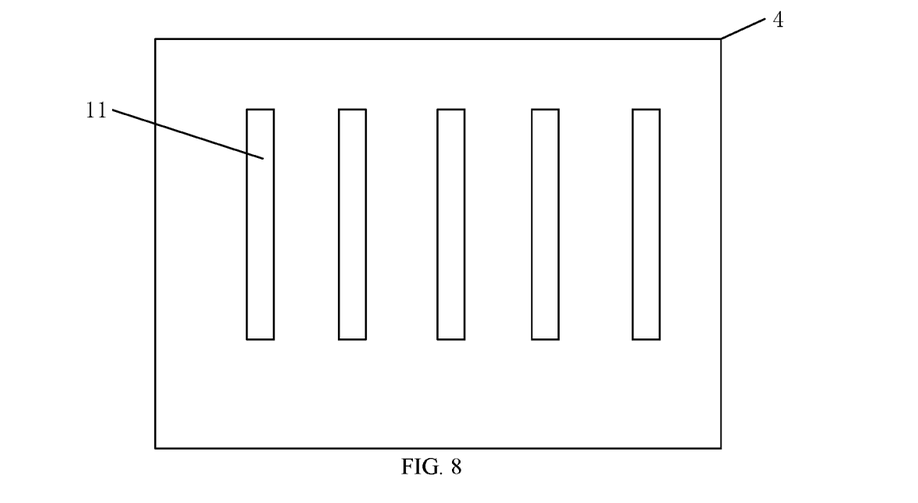
FIG. 8 is a schematic structural diagram of a first electrode in FIG. 3b.
Figure 9:
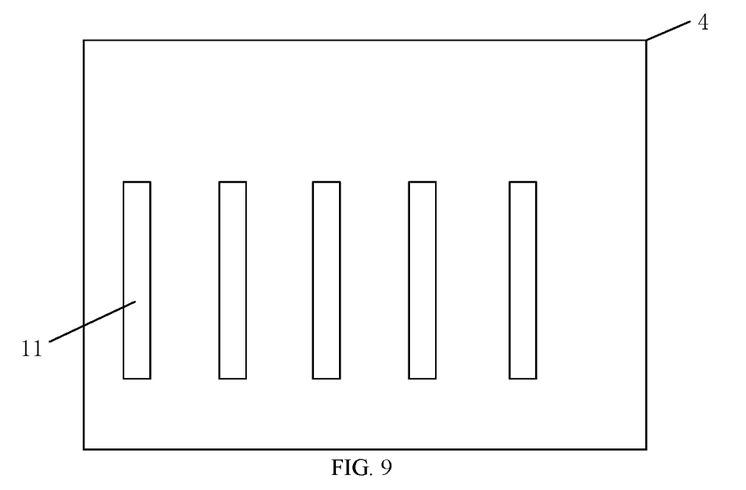

Referring the depictions in FIG. 7 to FIG. 9, each of the first electrodes includes a plurality of electrode units 11 which are not connected to each other, and orthographic projections of the plurality of electrode units on the substrate are within orthographic projections of the first and second comb electrodes on the substrate.

In the first electrode described above, each of the electrode units is not limited in specific structure, and may include a single strip electrode or a plurality of sub-electrodes.

Figure 3A:
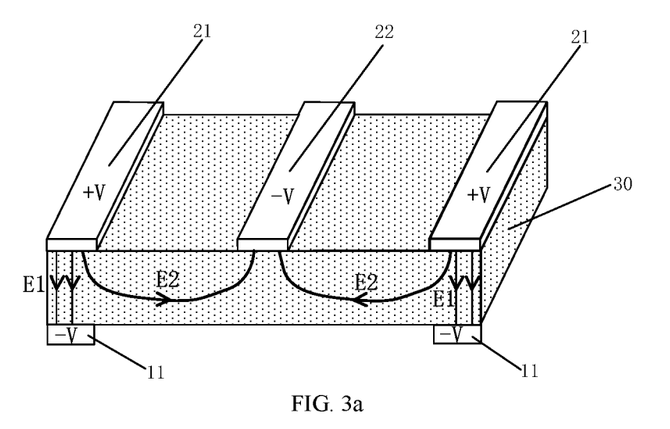
FIGS. 3a, 3b, and 3c are schematic diagrams of three-dimensional structures of three types of tactile reproduction devices according to embodiments of the present disclosure.
Figure 3B:
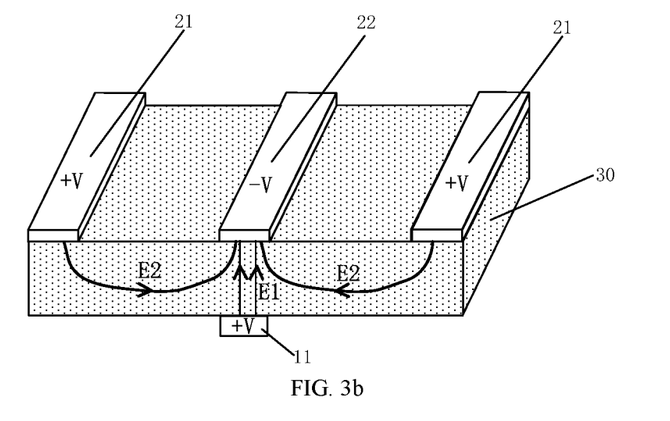
Figure 3C:
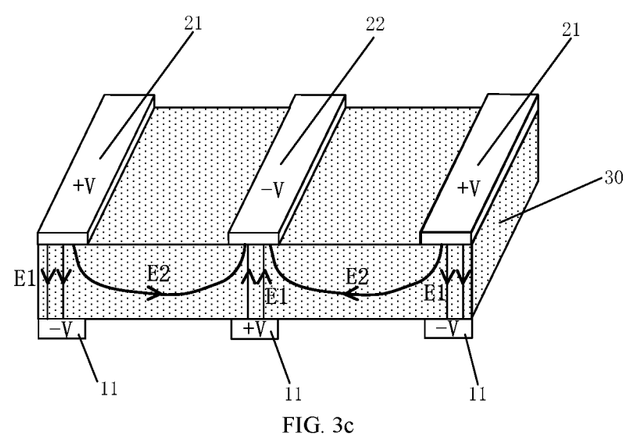

The above description that the orthographic projections of the plurality of electrode units on the substrate are within the orthographic projections of the first and second comb electrodes on the substrate includes: the orthographic projections of the plurality of electrode units on the substrate are within the orthographic projections of the first comb electrodes on the substrate, as an example, referring to the depiction in FIG. 3a, the electrode units 11 are only disposed below the first comb-teeth electrodes 21 of the first comb electrodes; or the orthographic projections of the plurality of electrode units on the substrate are within the orthographic projections of the second comb electrodes on the substrate, as an example, referring to the depiction in FIG. 3b, the electrode units 11 are only disposed below the second comb-teeth electrodes 22 of the first comb electrodes; or, the orthographic projections of some of the electrode units on the substrate are within the orthographic projections of the first comb electrodes on the substrate, and the orthographic projections of the remaining electrode units on the substrate are within the orthographic projections of the second comb electrodes on the substrate, as an example, referring to the depiction in FIG. 3c, the electrode units 11 are disposed below both the first comb-teeth electrodes 21 of the first comb electrodes and the second comb-teeth electrodes 22 of the second comb electrodes.

Each of the first electrodes includes a plurality of electrode units that are not connected to each other; and the orthographic projections of the plurality of electrode units on the substrate are within the orthographic projections of the first and second comb electrodes on the substrate, which reduces parasitic capacitance between the first electrodes and the second electrodes as much as possible while increasing the piezoelectric performances of the piezoelectric sections, thereby increasing the reliability of the device.

The first and second electrodes are both produced from a conductive material, which may include a transparent metal oxide, for example, indium tin oxide (ITO), aluminum-doped zinc oxide (AZO), etc. Or the conductive material may further include non-transparent metal, for example, gold, silver, copper, aluminum, etc. When the tactile reproduction device defined above is combined with a display panel to form a tactile reproduction apparatus, the first and second electrodes may be produced from the transparent metal oxide in order to reduce the impact of the tactile reproduction device on a display effect of the display panel. If the first and second electrodes are produced from the indium tin oxide or the aluminum-doped zinc oxide, the transmittance of the electrodes is up to 80%, and the transmittance of the overall tactile reproduction device may reach above 70%, which may meet the transmittance requirement of the tactile reproduction apparatus.

The second electrodes have a structure of interdigital electrodes. In each of the first comb electrodes, the plurality of first comb-teeth electrodes may or may not pass through the first comb-shank electrode. The latter case is depicted in FIG. 4 by way of example. Similarly, in each of the second comb electrodes, the plurality of second comb-teeth electrodes may or may not pass through the second comb-shank electrode. The latter case is depicted in FIG. 4 by way of example.

Figure 5A:
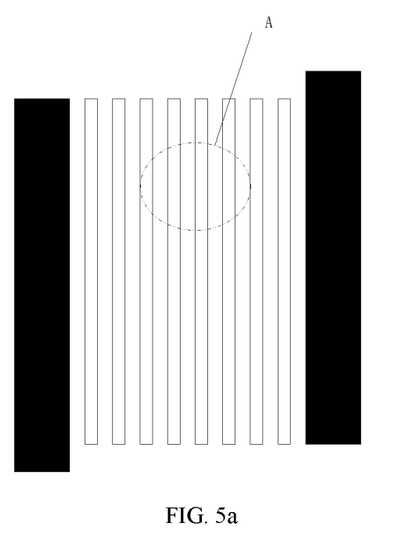
FIG. 5a is an entity picture of a second electrode according to an embodiment of the present disclosure.
Figure 5B:
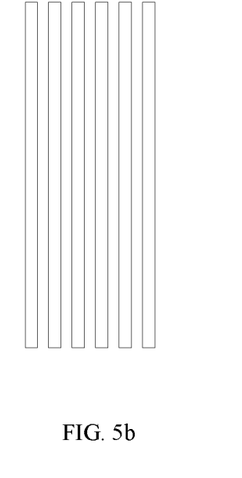

A width of each of the first and second comb-teeth electrodes in the second electrodes and a distance between the adjacent first and second comb-teeth electrodes are both not limited. As an example, referring to FIG. 4, a width L1 of each of the first comb-teeth electrodes 21, a width L2 of each of the second comb-teeth electrodes 22, a distance L3 between the adjacent first comb-teeth electrodes 21 and 22 may be all 10 microns, 15 micron, or 20 microns, etc. Then, corresponding interdigital numbers are 90, 60 and 44. FIG. 5a is an entity picture of a second electrode, and FIG. 5b is an enlarged view of a region A in FIG. 5a.

The first electrodes, the piezoelectric sections, and the second electrodes are not limited in thickness. As an example, the thickness of each of the first electrodes may be 500 nanometers, the thickness of each of the piezoelectric sections may be 2 microns, and the thickness of each of the second electrodes may be 200 nanometers. The piezoelectric sections are typically thin (not thicker than 2 microns), and vibrational strains are small in a direction perpendicular to the piezoelectric sections; and the second electrodes are of an interdigital electrode structure, and the distance L3 between the adjacent first and second comb-teeth electrodes may reach 20 microns, thereby greatly increasing a lateral amplitude of each of the piezoelectric sections.

The substrate may be a rigid substrate, for example, a glass substrate, or may also be a flexible substrate, for example, a polyimide substrate, a polyethylene terephthalate (PET) substrate, or polydimethylsiloxane (PDMS) substrate. This is not limited here.

The piezoelectric sections are not limited in material. Their materials may include a rigid piezoelectric material such as piezoelectric ceramics (PZT), where lead zirconate titanate binary-system piezoelectric ceramics may be used; or their materials may also include a flexible material such as polyvinylidene fluoride (PVDF) and a polyvinylidene difluoride-trifluoroethylene copolymer (PVDF-TrFE).

The piezoelectric sections demonstrate a piezoelectric effect (or called a piezoelectric performance). The piezoelectric effect includes a direct piezoelectric effect and an inverse piezoelectric effect. When a piezoelectric material is deformed by external forces, charges with opposite polarities will be generated on both surfaces of the piezoelectric material, which is called the direct piezoelectric effect. On the contrary, when an electric field is applied to the piezoelectric material, the piezoelectric material undergoes stretching vibrations to cause deformation, which is called the inverse piezoelectric effect. The tactile reproduction device described above is based on the inverse piezoelectric effect, where signals are applied to the first and second electrodes on both sides of the piezoelectric sections to produce electric fields; and the piezoelectric sections vibrate under the actions of the electric fields to change an effective coefficient of friction of the surface of the device, thereby implementing texture reproduction. It should be noted that the effective coefficient of friction is derived from actual tests and is equal to a ratio of a measured friction force to an applied pressure.

The following makes specific explanation based on the structure shown in FIG. 3. Referring to the depiction in FIG. 3a, when first voltage (−V) signal are applied to the electrode units 11 of the first electrodes and the second comb electrodes 22 of the second electrodes respectively, and second voltage (+V) signals are applied to the first comb electrodes 21 of the second electrodes, electric fields E1 perpendicular to the piezoelectric sections are formed between the first electrodes and the second electrodes, and strains generated by the piezoelectric sections between the first electrodes and the second electrodes are d31E1. In the second electrodes, the electric fields between the adjacent first and second comb-teeth electrodes 21 and 22 are E2, and strains generated by the piezoelectric sections 30 between the adjacent first and second comb-teeth electrodes 21 and 22 are $d_{33}E2$. Then, the total strain of the piezoelectric sections is $d_{31}E1+d_{33}E2$, where $d_{31}$ and $d_{33}$ are two types of piezoelectric constants; for each of the subscripts of $d_{33}$ and $d_{31}$, the first figure refers to an electric field direction, and the second figure refers to a stress or strain direction; and a polarization direction of $d_{33}$ is the same as its strain direction, and a polarization direction of $d_{31}$ is vertical to its strain direction. Compared with the structure shown in FIG. 1, an increment of the strain is $d_{31}E1$. Therefore, the effective utilization rate of the piezoelectric sections is improved, and the piezoelectric performance is increased. FIG. 3a only shows a structure that the electrode units 11 of the first electrode are below the first comb-teeth electrodes 21. For other structures, a reference may be made to the description above, and their details will not be repeated here anymore. It should be noted that in FIG. 3a to FIG. 3c, +V represents a voltage signal greater than a reference voltage; −V represents a voltage signal smaller than the reference voltage; and a reference voltage signal may include a ground signal, etc. Without doubt, the first and second voltage signals may further include other types of voltage signals, as long as the electric fields are generated between the first and second electrodes and between the first and second comb electrodes.

An embodiment of the present disclosure provides a tactile reproduction device, where different in voltage signals are input to the first and second comb electrodes of the second electrodes respectively, in such a way that electric fields are generated between the adjacent first and second comb electrodes, thereby allowing the piezoelectric sections between the first and second comb electrodes to vibrate. Meanwhile, voltage signals are input to the first electrodes in such a way that electric fields are produced between the first and second electrodes, thereby causing the piezoelectric sections below the first and second comb electrodes to vibrate. In this way, the vibrations of the piezoelectric sections are effectively enhanced under the actions of the above mentioned two electric fields, thereby improving the efficiency in changing the effective coefficient of friction of the surface of the device based on the vibrations. As a result, the efficiency of simulating a texture is improved. In addition, each of the first electrodes includes a plurality of electrode units that are not connected to each other; and the orthographic projections of the plurality of electrode units on the substrate are within the orthographic projections of the first and second comb electrodes on the substrate, which maximally reduces parasitic capacitance between the first electrodes and the second electrodes while increasing the piezoelectric performances of the piezoelectric sections, thereby increasing the reliability of the device.

The following provides a specific structure of the first electrode.

Referring to the depictions in FIG. 3a and FIG. 9, the orthographic projections of the plurality of electrode units 11 on the substrate 4 are within the orthographic projections of the plurality of first comb-teeth electrodes 21 on the substrate 4; and here, the plurality of electrode units 11 are only disposed below the plurality of first comb-teeth electrodes 21 of each of the first comb-teeth electrodes. FIG. 9 is a schematic structural diagram of a first electrode in FIG. 3a.

In each of the first comb electrodes, one electrode unit may be disposed below the respective first comb-teeth electrode; or, the electrode units are disposed below some of the first comb-teeth electrodes, and no electrode unit is disposed below the remaining first comb-teeth electrodes. The former is selected in consideration of increasing the magnitude of strains of the piezoelectric sections as much as possible.

The above-mentioned structure shown in FIG. 3a is simple to design and convenient for a subsequent drive design; and meanwhile, the plurality of electrode units are only disposed below the plurality of first comb-teeth electrodes of each of the first comb electrodes, which greatly reduces the parasitic capacitance between the first electrodes and the second electrodes.

Or, referring to the depictions in FIG. 3b and FIG. 8, the orthographic projections of the plurality of electrode units 11 on the substrate 4 are within the orthographic projections of the plurality of second comb-teeth electrodes 22 on the substrate 4; and here, the plurality of electrode units 11 are only disposed below the plurality of second comb-teeth electrodes 22 of the second comb electrodes. FIG. 8 is a schematic structural diagram of a first electrode in FIG. 3b.

In each of the second comb electrodes, one electrode unit may be disposed below the respective second comb-teeth electrode; or, the electrode units are disposed below some of the second comb-teeth electrodes, and no electrode unit is disposed below the remaining second comb-teeth electrodes. The former is selected in consideration of increasing the magnitudes of strains of the piezoelectric sections as much as possible.

The above-mentioned structure shown in FIG. 3b is simple to design and convenient for a subsequent drive design; and meanwhile, the plurality of electrode units are only disposed below the plurality of second comb-teeth electrodes of each of the second comb electrodes, which greatly reduces the parasitic capacitance between the first electrodes and the second electrodes.

The following provides another specific structure of the first electrode.

Referring to the depictions in FIG. 3c and FIG. 7, the plurality of electrode units are divided into a first group and a second group. Orthographic projections of the first group of electrode units (the plurality of electrode units 11 in a first row in FIG. 7) on the substrate 4 are within the orthographic projections of the plurality of first comb-teeth electrodes 21 on the substrate 4; and orthographic projections of the second group of electrode units (the plurality of electrode units 11 in a second row in FIG. 7) on the substrate 4 are within the orthographic projections of the plurality of second comb-teeth electrodes 22 on the substrate 4. Then, the first group of electrode units are disposed below the plurality of first comb-teeth electrodes 21 of the first comb electrodes, and the second group of electrode units are disposed below the plurality of second comb-teeth electrodes 22 of the second comb electrodes. FIG. 7 is a schematic structural diagram of a first electrode in FIG. 3c.

The structure described above may increase effective regions of the piezoelectric sections as many as possible to increase the magnitudes of strains of the piezoelectric sections, and meanwhile to reduce the parasitic capacitance between the first electrodes and the second electrodes.

To further increase the magnitudes of strains of the piezoelectric sections, referring to the depiction in FIG. 7, the firs group of electrode units (the plurality of electrode units 11 in the first row in FIG. 7) and the second group of electrode units (the plurality of electrode units 11 in the second row in FIG. 7) are arranged at an interval.

Optionally, each of the electrode units includes a plurality of connected sub-electrodes. The specific shape of the sub-electrodes and the arrangement form of the plurality of sub-electrodes are not limited here.

Figure 10:
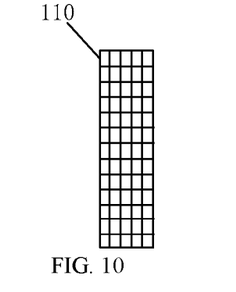
FIG. 10 is a schematic structural diagram of an electrode unit according to an embodiment of the present disclosure.
Figure 11:
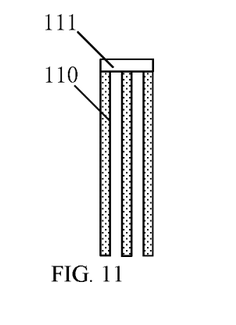
FIG. 11 is a schematic structural diagram of another electrode unit according to an embodiment of the present disclosure.

Further optionally, to effectively disperse the current density and prevent a circuit from being burnt due to the excessive current density of a single channel when an excessively high voltage is applied, referring to the depiction in FIG. 10, the plurality of sub-electrodes 110 are arranged in a grid shape, and then, the sub-electrodes may be linear. Or, referring to the depiction in FIG. 11, the plurality of sub-electrodes 110 are arranged in parallel. Referring to the depiction in FIG. 11, the electrode units may further includes connecting lines 111, which are connected to the sub-electrodes 110, respectively. In addition, if the electrodes units are made of non-transparent metal such as gold, silver, copper, aluminum, etc., the structure with the plurality of sub-electrodes arranged in the grid shape may also effectively increase the transmittance to avoid a large number of non-transparent regions, thereby facilitating the integration with a display panel. As an example, if a line width of each of the sub-electrodes is less than 8 microns and a distance between the adjacent sub-electrodes is less than 8 microns, the transmittance of the electrode units may reach above 50%.

Optionally, materials for the first and second electrodes include a transparent metal oxide. As an example, the transparent metal oxide may include indium tin oxide (ITO), aluminum-doped zinc oxide (AZO), etc. Then, when the above-mentioned tactile reproduction device is combined with the display panel to form the tactile reproduction apparatus, the impact of the tactile reproduction device on the display effect of the display panel may be greatly reduced since the material of the first and second electrodes includes the transparent metal oxide. As an example, if the first and second electrodes are made from the indium tin oxide or the aluminum-doped zinc oxide, the transmittance of the electrodes is up to 80%, and the transmittance of the overall tactile reproduction device may reach above 70%, which may meet the transmittance requirement of the tactile reproduction apparatus.

Figure 6A:
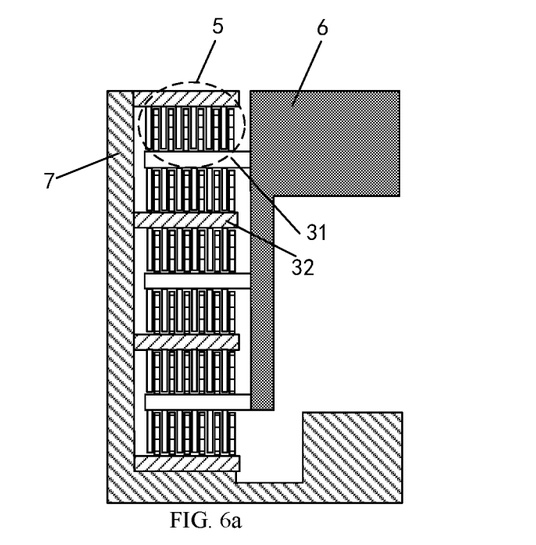
FIG. 6a is a schematic structural diagram of another tactile reproduction device according to an embodiment of the present disclosure.

It should be noted that, the tactile reproduction device may further include a plurality of electrode leads or a plurality of connection electrodes for transmitting signals to the first and second electrodes to generate electric fields, allowing strains to occur in the piezoelectric sections. As an example, referring to the depiction in FIG. 6, the tactile reproduction device may further include a first connection electrode 6 and a second connection electrode 7, where the first connection electrode 6a is connected to the first comb-shank electrodes 31 in the plurality of piezoelectric units 5; the second connection electrode 7 is connected to the second comb-shank electrodes 32 in the plurality of electrode units 2; and in FIG. 6, the second electrodes of the two adjacent piezoelectric units share one comb-shank electrode.

Figure 6B:
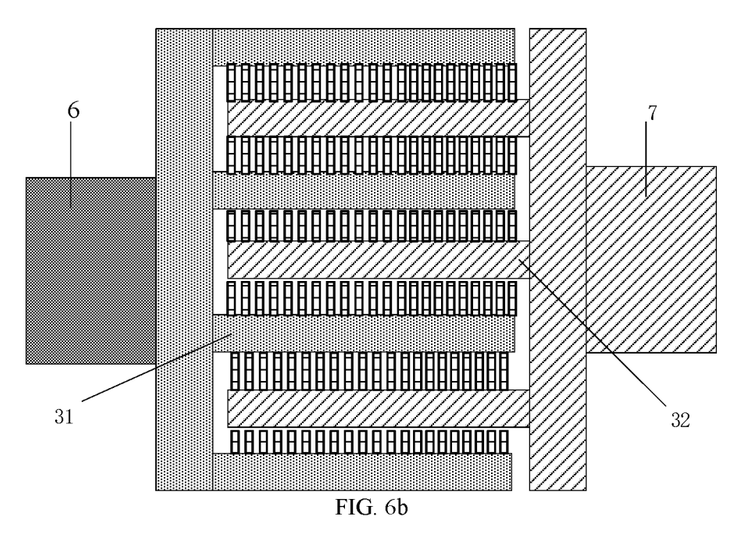
FIG. 6b is a schematic structural diagram of another tactile reproduction device according to an embodiment of the present disclosure.
Figure 6C:
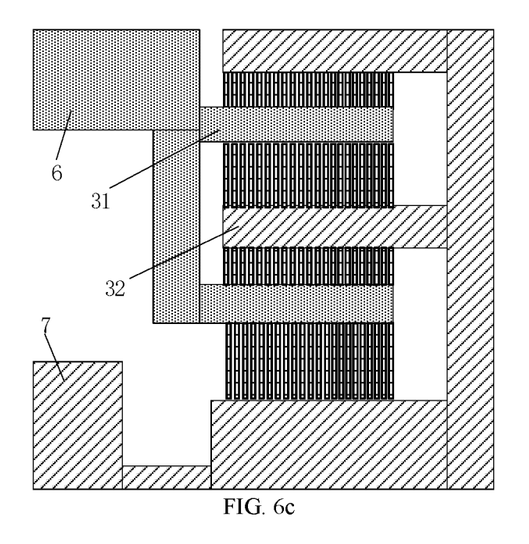
FIG. 6c is a schematic structural diagram of another tactile reproduction device according to an embodiment of the present disclosure.
Figure 6D:
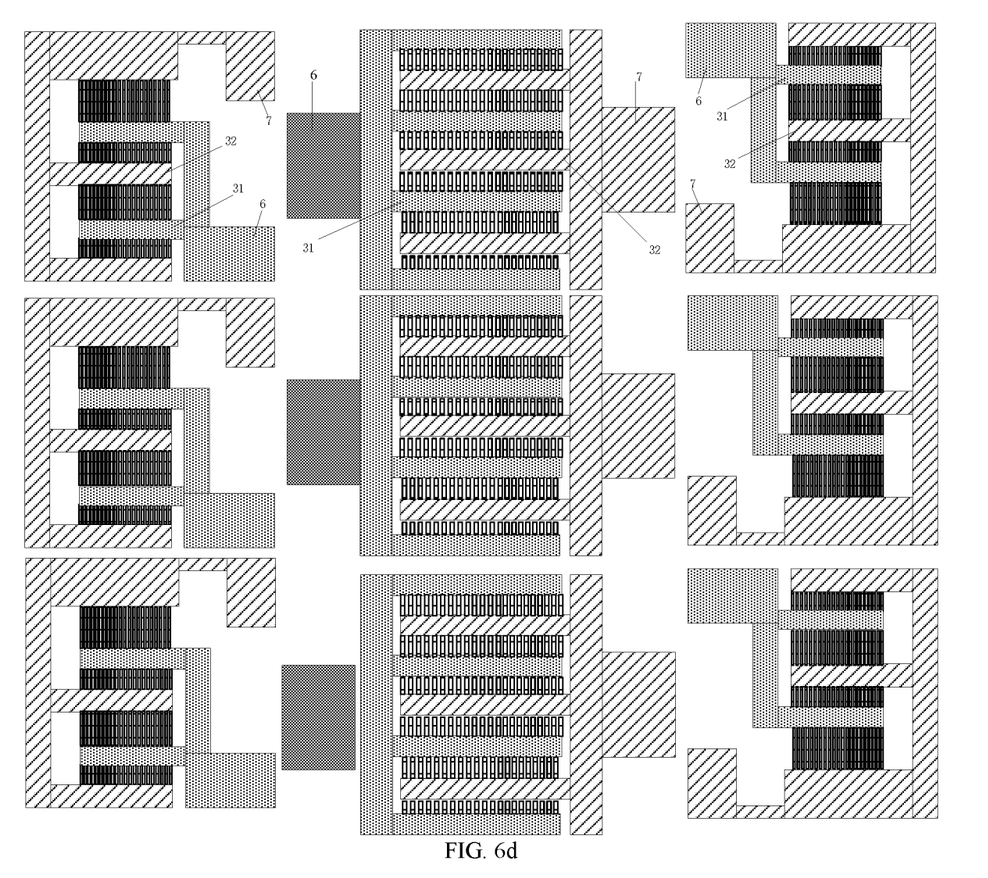
FIG. 6d is a schematic combination diagram of a tactile reproduction device.

FIG. 6b is a schematic structural diagram of another tactile reproduction device according to an embodiment of the present disclosure; FIG. 6c is a schematic structural diagram of another tactile reproduction device according to an embodiment of the present disclosure; FIG. 6d is a schematic combination diagram of a tactile reproduction device from FIGS. 6a to 6c. According to FIG. 6b and FIG. 6c, it may be known that the electrodes of the tactile reproduction device have different shapes. According to FIG. 6d, FIG. 6a to FIG. 6c provides different shapes of tactile reproduction device may be lined up and made at the same time to maximize the use of space.

An embodiment of the present disclosure further provides a tactile reproduction apparatus, which includes: a display panel and the tactile reproduction device defined above.

Here, the tactile reproduction device is disposed at a light emergent side of the display panel, and is configured to cause different vibrations depending on control signals of the display panel, so as to change an effective coefficient of friction of a surface of the tactile reproduction apparatus.

The display panel may be a rigid display panel or a flexible (i.e., bendable or foldable) display panel, and may be a twisted nematic (TN) type, a vertical alignment (VA) type, a in-plane switching (IPS) type, or an advanced super dimension switch (ADS) type liquid crystal display pane, or an organic light-emitting diode (OLED) display panel, or a Micro LED or Mini LED display panel. This may be specifically determined according to actual needs.

The tactile reproduction apparatus may realize tactile reproduction without affecting the display, and has good product performance and good user experience.

An embodiment of the present disclosure further provides a method for driving the tactile reproduction device defined above. The method includes the following steps.

In S01, first signals are input to the first comb electrodes of the second electrodes.

Specifically, the first signals may be input to the first comb-shank electrodes of the first comb electrodes through electrode leads.

In S02, second signals are input to the second comb electrodes of the second electrodes, where the first signals and the second signals are different in voltage signals.

Specifically, the second signals may be input to the second comb-shank electrodes of the second comb electrodes through electrode leads. The first and second signals are not specifically limited in type here. As an example, the first signals may include a reference voltage signal which may be a ground signal; the second signals may include pulse signals that fluctuate up and down with the reference voltage signal as a median value, where the pulse signals may be sine wave signals or square wave signals. For example, the first signals may include the ground signal, i.e., indicating the first comb electrodes are grounded; and the second signals may include an alternating-current signal, where an alternating-current voltage value may be 1-3 kV/mm.

In S03, signals are input to the first electrodes in such a way that the first electrodes and the second electrodes form electric field that are parallel with a thickness direction of each of the piezoelectric sections. Here, the thickness of each of the piezoelectric sections refers to the thickness of the piezoelectric section along a direction perpendicular to the substrate.

Steps S01-S03 are executed in such a way that the piezoelectric sections between the first comb electrodes and the second comb electrodes undergo $d_{33}$ vibrations, and meanwhile, the piezoelectric sections between the first electrodes and the second electrodes undergo $d_{31}$ vibrations, which greatly increase the overall vibrations of the piezoelectric sections and improve the magnitudes of strains of the piezoelectric sections, thereby improving the performance of the tactile reproduction device.

The following specifically explains how to drive the first electrodes based on the specific structure of the first electrodes.

Optionally, the orthographic projections of the plurality of electrode units of the first electrodes on the substrate are within the orthographic projections of the plurality of first comb-teeth electrodes of the second electrodes on the substrate; and here, the plurality of electrode units are only disposed below the first comb electrodes.

In S03, inputting the signals to the first electrodes includes:

S010, inputting third signals to the plurality of electrode units, where the third signals and the first signals are different in voltage signals.

It should be noted that the same voltage signal may be selected for the third and second signals, for example, both the third and second signals may be the pulse signal; or different in voltage signals may be selected for the third and second signals. The former may be selected in consideration of reducing the design difficulty.

Optionally, the orthographic projections of the plurality of electrode units of the first electrodes on the substrate are within the orthographic projections of the plurality of second comb-teeth electrodes of the second electrodes on the substrate; and here, the plurality of electrode units are only disposed below the second comb electrodes.

In S03, inputting the signals to the first electrodes includes:

S020, inputting fourth signals to the plurality of electrode units, where the fourth signals and the second signals are different in voltage signals.

It should be noted that the same voltage signal may be selected for the fourth and first signals, for example, both the fourth and first signals may be the ground signals; or different in voltage signals may be selected for the fourth and first signals. The former may be selected in consideration of reducing the design difficulty.

Optionally, the plurality of electrode units of each of the first electrodes are divided into a first group and a second group; the orthographic projections of the first group of the electrode units on the substrate are within the orthographic projections of the plurality of first comb-teeth electrodes on the substrate; and the orthographic projections of the second group of the electrode units on the substrate are within the orthographic projections of the plurality of second comb-teeth electrodes on the substrate. Then, the plurality of electrode units are disposed below both the first and second comb electrodes.

In S03, inputting the signals to the first electrodes includes:

S031, inputting third signals to the first group of the electrode units, where the third signals and the first signals are different in voltage signals; and S032, inputting fourth signals to the second group of the electrode units, where the fourth signals and the second signals are different in voltage signals.

It should be noted that the same voltage signal may be selected for the third and second signals, for example, both the third and second signals may be the pulse signal; or different in voltage signals may be selected for the third and second signals. The former may be selected in consideration of reducing the design difficulty.

The same voltage signal may be selected for the fourth and first signals, for example, both the fourth and first signals may be the ground signals; or different in voltage signals may be selected for the fourth and first signals. The former may be selected in consideration of reducing the design difficulty.

An embodiment of the present disclosure additionally provides a method for producing the tactile reproduction device. The method includes the following steps.

In S10, a plurality of first electrodes, a plurality of piezoelectric sections and a plurality of second electrodes are formed and laminated on a substrate in sequence. Each of the second electrodes includes: a first comb electrode and a second comb electrode; the first comb electrode includes: a plurality of first comb-teeth electrodes and a first comb-shank electrode connecting the plurality of first comb-teeth electrodes; the second comb electrode includes: a plurality of second comb-teeth electrodes and a second comb-shank electrode connecting the plurality of second comb-teeth electrodes; and the plurality of first comb-teeth electrodes and the plurality of second comb-teeth electrodes are mutually intersected. Each of the first electrodes includes a plurality of electrode units which are not connected to each other; and orthographic projections of the plurality of electrode units on the substrate are within orthographic projections of the first and second comb electrodes on the substrate.

The first and second electrodes may be produced by a photoetching process, and without doubt, may be produced by other processes, which is not limited here.

For example, The ITO film layer on the substrate may be first deposited to obtain the optimal parameters for making the ITO film layer, to ensure low resistivity and high light transmittance. After that, first electrodes are provided on the substrate, which including a plurality of electrode units that are not connected to each other, to achieve the lowest possible parasitic capacitance between the first electrodes and the second electrodes while improving the piezoelectric performance of the piezoelectric part, thereby improving the reliability of the device. Then, the PZT film of the piezoelectric section is deposited and etched to expose part of the first electrodes for increasing the breakdown voltage between the first electrodes and the second electrodes. Finally, the second electrodes as the interdigit electrodes, are deposited and photo-etched.

After the second electrodes are produced, the method may further include:

S11, polarizing the plurality of second electrodes.

Specifically, the first comb electrodes in the second electrodes may be grounded, and the second comb electrodes in the second electrodes may be connected to a high voltage, so that a polarization direction of each of the piezoelectric sections is a direction on a plane.

Optionally, the substrate includes a rigid substrate; and forming the plurality of piezoelectric sections includes: forming a plurality of piezoelectric sections by a magnetron sputtering process.

Here, the thickness of each of the piezoelectric sections may be 0.5-2 microns. Compared with a sol-gel method, preparing the piezoelectric sections with the magnetron sputtering process has the advantages such as simple preparation process, dense and crackles film layers, precisely controllable thickness, and uniform components. In particular, when the glass substrate is used, the problem that a glass base plate is cracked due to repeated heating and cooling during the process of preparing the film layer with the sol-gel method is avoided.

The above description only provides the specific embodiments of the present disclosure, but the protection scope of the present disclosure is not limited thereto. Any variations or substitutions easily conceivable by a person skilled in the art within the technical scope of the present disclosure should be included within the protection scope of the present disclosure. Therefore, the protection scope of the present disclosure should be subjected to the protection scope of the claims.

What is claimed is:

1. A tactile reproduction device, comprising: a substrate, and a plurality of piezoelectric units that are disposed on the substrate in an array arrangement, wherein
   each of the piezoelectric units comprises: laminated arranging a first electrode, a piezoelectric section, and a second electrode in sequence on the substrate;
   each of the second electrodes comprises: a first comb electrode and a second comb electrode, the first comb electrode comprises: a plurality of first comb-teeth electrodes and a first comb-shank electrode connecting the plurality of first comb-teeth electrodes, the second comb electrode comprises: a plurality of second comb-teeth electrodes and a second comb-shank electrode connecting the plurality of second comb-teeth electrodes, and the plurality of first comb-teeth electrodes and the plurality of second comb-teeth electrodes are mutually intersected; and each of the first electrodes comprises a plurality of electrode units which are not connected to each other, and orthographic projections of the plurality of electrode units on the substrate are within orthographic projections of the first and second comb electrodes on the substrate.

2. The tactile reproduction device according to claim 1, wherein the orthographic projections of the plurality of electrode units on the substrate are within orthographic projections of the plurality of first comb-teeth electrodes on the substrate;

or the orthographic projections of the plurality of electrode units on the substrate are within orthographic projections of the plurality of second comb-teeth electrodes on the substrate.

3. The tactile reproduction device according to claim 1, wherein the plurality of electrode units are divided into a first group and a second group; orthographic projections of the first group of the electrode units on the substrate are within orthographic projections of the plurality of first comb-teeth electrodes on the substrate; and orthographic projections of the second group of the electrode units on the substrate are within orthographic projections of the plurality of second comb-teeth electrodes on the substrate.

4. The tactile reproduction device according to claim 3, wherein the first group of the electrode units and the second group of the electrode units are arranged at interval.

5. The tactile reproduction device according to claim 1, wherein each of the electrode units comprises a plurality of connected sub-electrodes.

6. The tactile reproduction device according to claim 5, wherein the plurality of sub-electrodes are arranged in a grid shape or in parallel.

7. The tactile reproduction device according to claim 1, wherein materials for the first and second electrodes comprise a transparent metal oxide.

8. The tactile reproduction device according to claim 1, wherein the material for the substrate comprises at least one of followings: Polyimide, Polyethylene Terephthalate and Polydimethylsiloxane.

9. The tactile reproduction device according to claim 1, wherein the material for the piezoelectric section comprises at least one of followings: polyvinylidene fluoride and polyvinylidene difluoride-trifluoroethylene copolymer.

10. A tactile reproduction apparatus, comprising a display panel and the tactile reproduction device according to claim 1, wherein the tactile reproduction device is disposed at a light emergent side of the display panel, and is configured to cause different vibrations depending on a control signal of the display panel, so as to change an effective coefficient of friction of a surface of the tactile reproduction apparatus.

11. The tactile reproduction apparatus according to claim 10, wherein the orthographic projections of the plurality of electrode units on the substrate are within orthographic projections of the plurality of first comb-teeth electrodes on the substrate;

or the orthographic projections of the plurality of electrode units on the substrate are within orthographic projections of the plurality of second comb-teeth electrodes on the substrate.

12. The tactile reproduction apparatus according to claim 10, wherein the plurality of electrode units are divided into a first group and a second group; orthographic projections of the first group of the electrode units on the substrate are within orthographic projections of the plurality of first comb-teeth electrodes on the substrate; and orthographic projections of the second group of the electrode units on the substrate are within orthographic projections of the plurality of second comb-teeth electrodes on the substrate.

13. The tactile reproduction apparatus according to claim 12, wherein the first group of the electrode units and the second group of the electrode units are arranged at interval.

14. The tactile reproduction apparatus according to claim 10, wherein each of the electrode units comprises a plurality of connected sub-electrodes.

15. The tactile reproduction apparatus according to claim 14, wherein the plurality of sub-electrodes are arranged in a grid shape or in parallel.

16. The tactile reproduction apparatus according to claim 10, wherein materials for the first and second electrodes comprise a transparent metal oxide.

17. A method for driving the tactile reproduction device according to claim 1, comprising:

inputting first signals to the first comb electrodes of the second electrodes;

inputting second signals to the second comb electrodes of the second electrodes, wherein the first signals and the second signals are different in voltage signals; and inputting signals to the first electrodes in such a way that the first electrodes and the second electrodes form electric fields that are parallel with a thickness direction of each of the piezoelectric sections.

18. The method according claim 17, wherein the orthographic projections of the plurality of electrode units of the first electrodes on the substrate are within the orthographic projections of the plurality of first comb-teeth electrodes of the second electrodes on the substrate; and inputting the signals to the first electrodes comprises:

inputting third signals to the plurality of electrode units, wherein the third signals and the first signals are different in voltage signals.

19. The method according to claim 17, wherein the orthographic projections of the plurality of electrode units of the first electrodes on the substrate are within the orthographic projections of the plurality of second comb-teeth electrodes of the second electrodes on the substrate; and inputting the signals to the first electrodes comprises:

inputting fourth signals to the plurality of electrode units, wherein the fourth signals and the second signals are different in voltage signals.

20. The method according to claim 17, wherein the plurality of electrode units of each of the first electrodes are divided into a first group and a second group, the orthographic projections of the first group of the electrode units on the substrate are within the orthographic projections of the plurality of first comb-teeth electrodes on the substrate, and the orthographic projections of the second group of the electrode units on the substrate are within the orthographic projections of the plurality of second comb-teeth electrodes on the substrate;

inputting the signals to the first electrodes comprises:

inputting third signals to the first group of the electrode units, wherein the third signals and the first signals are different in voltage signals; and inputting fourth signals to the second group of the electrode units, wherein the fourth signals and the second signals are different in voltage signals.

* * * * *